United States Patent [19]

Blum et al.

[11] Patent Number: 5,350,663
[45] Date of Patent: Sep. 27, 1994

[54] PRODUCTION OF STRUCTURED LAYERS OF HEAT-RESISTANT POLYCONDENSATES

[75] Inventors: Rainer Blum; Hans-Joachim Haehnle, both of Ludwigshafen; Gerhard Hoffmann, Otterstadt, all of Fed. Rep. of Germany

[73] Assignee: BASF Lacke+ Farben Aktiengesellschaft, Muenster, Fed. Rep. of Germany

[21] Appl. No.: 67,620

[22] Filed: May 27, 1993

[30] Foreign Application Priority Data

Jun. 6, 1992 [DE] Fed. Rep. of Germany ....... 4218718

[51] Int. Cl.$^5$ ................................................. G03C 5/00
[52] U.S. Cl. ..................................... 430/330; 430/283; 430/325
[58] Field of Search ..................... 430/330, 329, 283

[56] References Cited

U.S. PATENT DOCUMENTS 4,040,831  8/1977  Rubner et al. .
4,551,522  11/1985 Fryd et al. .
4,610,947  9/1986  Ahne .................................. 430/330

FOREIGN PATENT DOCUMENTS 2437397  2/1976  Fed. Rep. of Germany .
3411967  10/1985 Fed. Rep. of Germany .

Primary Examiner—Jack P. Brammer
Attorney, Agent, or Firm—Keil & Weinkauf

[57] ABSTRACT

Structured layers of heat-resistant polycondensates are prepared by a process wherein ethylenically unsaturated tetracarboxylates or adducts or salts of tetracarboxylates, which still contain at least one unesterified carboxylic acid group, with ethylenically unsaturated amines, amides or onium compounds mixed with compounds which contain amino, isocyanate or blocked isocyanate groups and can be subjected to polycondensation with the tetracarboxylates are applied as a layer to a substrate, this layer is exposed through a negative, the unexposed, soluble parts are then removed and the insoluble parts are converted into the final polycondensate form at elevated temperatures.

2 Claims, No Drawings

PRODUCTION OF STRUCTURED LAYERS OF HEAT-RESISTANT POLYCONDENSATES

The present invention relates to a process for the production of structured layers of heat-resistant polycondensates.

Structured layers of heat-resistant polycondensates, for example for the construction of electrical circuits and protective or insulating layers for electronic components, can be produced by applying soluble precursors of the polycondensates, which precursors are radiation-sensitive, i.e. contain ethylenically unsaturated groups, to a substrate, exposing the applied layer through a negative to form an insoluble intermediate which is crosslinked (by means of free radicals), removing the unexposed, soluble parts and converting the structured layer into the heat-resistant polycondensate by heating.

Corresponding radiation-sensitive prepolymers, for example polyamic acids, are used as soluble, radiation-sensitive precursors of the polycondensates, for example polyimides.

DE-A-24 37 397 and DE-A-34 11 697 disclose that such prepolymers can be prepared by reacting ethylenically unsaturated tetracarboxylates with diamino compounds or diisocyanate compounds. According to DE-A-24 37 397, the acyl chlorides of the tetracarboxylates are used as starting materials, and according to DE-A-34 11 697 the reaction is carried out in the presence of a carbodiimide. A corresponding process for the preparation of radiation-sensitive polyamic acids is described in U.S. Pat. No. 4,551,522.

In the processes known to date, it is therefore necessary first to prepare, in a prior process step, soluble, radiation-sensitive precursors, i.e. prepolymers for the process described above.

Prepolymers, for example polyamic acids, as radiation-sensitive precursors furthermore have the disadvantage that the solutions of the prepolymers and compounds condensable therewith are limited in their solids content by the high viscosity of the prepolymer and, owing to the presence of reactive terminal groups, generally have a short shelf life.

It is an object of the present invention to provide a process in which the necessity for the preparation of prepolymers as precursors is dispensed with.

We have found that this object is achieved by a process for the production of a structured layer of a heat-resistant polycondensate, wherein ethylenically unsaturated tetracarboxylates or adducts or salts of tetracarboxylates, which still contain at least one unesterified carboxylic acid group, with ethylenically unsaturated amines, amides or onium compounds mixed with compounds which contain amino, isocyanate or blocked isocyanate groups and can be subjected to polycondensation with the tetracarboxylates are applied as a layer to a substrate, this layer is exposed through a negative, the unexposed, soluble parts are then removed and the insoluble parts are converted into the polycondensate form at elevated temperatures.

We have furthermore found liquid mixtures for this process which contain ethylenically unsaturated tetracarboxylates or adducts or salts of tetracarboxylates, which still contain at least one unesterified carboxylic acid group, with ethylenically unsaturated amines, amides or onium compounds, compounds which can be subjected to polycondensation with the tetracarboxylates and contain amino, isocyanate or blocked isocyanate groups, and at least one photoinitiator.

The ethylenically unsaturated tetracarboxylates and adducts or salts of tetracarboxylates, which still contain at least one unesterified carboxylic acid group, with ethylenically unsaturated amines, amides or onium compounds are referred to collectively below as radiation-sensitive tetracarboxylic acid derivatives.

In the novel process, radiation-sensitive tetracarboxylic acid derivatives mixed with compounds which are polycondensable therewith and contain amino, isocyanate or blocked isocyanate groups are applied as a layer to a substrate.

Ethylenically unsaturated tetracarboxylates can be prepared, for example, by reacting tetracarboxylic acids or anhydrides thereof with ethylenically unsaturated alcohols.

Examples of unsaturated alcohols are allyl alcohol or hydroxyalkyl (meth)acrylates, in particular hydroxy-$C_2$-$C_6$-alkyl (meth)acrylates, such as hydroxyethyl (meth)acrylate, hydroxy-n-propyl (meth)acrylate and hydroxy-n-butyl (meth)acrylate.

Further examples are N-hydroxymethyl (meth)acrylamide, diethylene glycol mono(meth)acrylate, cinnamyl alcohol, hydroxyalkylcinnamates and also alcohols having a plurality of unsaturated groups, such as glyceryl di(meth)acrylate, trimethylolpropane di(meth)acrylate and pentaerythrityl tri(meth)acrylate.

If necessary, unsaturated alcohols having a plurality of hydroxyl groups, for example two hydroxyl groups, may also be used. However, monoalcohols are preferred.

Particularly suitable tetracarboxylic acids or anhydrides thereof are aromatic or partly aromatic tetracarboxylic acids having at least one aromatic ring. These may be tetracarboxylic acids having an aromatic ring, fused aromatic ring systems or aromatic rings which are bonded, for example, by a single bond, an ether, carbonyl or sulfonyl group or aliphatic carbon radicals, in particular of 1 to 8 carbon atoms and, if required, also hetero atoms, such as oxygen, sulfur or nitrogen. The aromatic rings or ring systems may carry in particular $C_1$-$C_6$-alkyl or alkoxy groups or halogen atoms, such as chlorine or fluorine, as substituents.

Examples are the following tetracarboxylic acids and anhydrides thereof.

Pyromellitic acid,
benzene-1,2,3,4-tetracarboxylic acid,
4,4-esterification, 4,4-etherification and 4,4-amidation dimers of trimellitic acid,
3,3',4,4'-biphenyltetracarboxylic acid,
2,2',4,4'-biphenyltetracarboxylic acid,
2,3,3',4'-biphenyltetracarboxylic acid,
3,3',4,4'-benzophenonetetracarboxylic acid,
2,2',3,3'-benzophenonetetracarboxylic acid,
2,3,3',4'-benzophenonetetracarboxylic acid,
2,3,6,7-naphthalenetetracarboxylic acid,
1,2,5,6-naphthalenetetracarboxylic acid,
1,2,4,5-naphthalenetetracarboxylic acid,
1,4,5,8-naphthalenetetracarboxylic acid,
1,2,6,7-naphthalenetetracarboxylic acid,
2,6-dichloronaphthalene-1,4,5,8-tetracarboxylic acid,
2,7-dichloronaphthalene-1,4,5,8-tetracarboxylic acid,
2,3,6,7-tetrachloronaphthalene-1,4,5,8-tetracarboxylic acid,
1,4,5,8-tetrachloronaphthalene-1,4,5,8-tetracarboxylic acid, 4,8-dimethyl-1,2,3,5,6,7-hexahydronaphthalene-1,2,5,6-tetracarboxylic acid,
4,8-dimethyl-1,2,3,5,6,7-hexahydronaphthalene-2,3,6,7-tetracarboxylic acid,
4,4'-oxydiphthalic acid,
3,3'-oxydiphthalic acid,
4,4'-sulfonyldiphthalic acid,
4,4'-thiodiphthalic acid,
3,3'-thiodiphthalic acid,
4,4'-acetylidenediphthalic acid,
bis(2,3-dicarboxyphenyl)methane,
bis(3,4-dicarboxyphenyl)methane,
1,1-bis(2,3-dicarboxyphenyl)ethane,
1,1-bis(3,4-dicarboxyphenyl)ethane,
2,2-bis(2,3-dicarboxyphenyl)propane,
2,2-bis(3,4-dicarboxyphenyl)propane,
phenanthrene-1,2,7,8-tetracarboxylic acid,
phenanthrene-1,2,6,7-tetracarboxylic acid,
phenanthrene-3,4,5,6-tetracarboxylic acid,
phenanthrene-1,2,9,10-tetracarboxylic acid,
2,3,9,10-perylenetetracarboxylic acid,
3,4,9,10-perylenetetracarboxylic acid,
2,3,8,9-perylenetetracarboxylic acid,
4,5,10,11-perylenetetracarboxylic acid,
4,5,10,12-perylenetetracarboxylic acid,
3,3'',4,4''-p-terphenyltetracarboxylic acid,
2,2'',3,3''-p-terphenyltetracarboxylic acid,
2,3,3'',4''-p-terphenyltetracarboxylic acid,
butane-1,2,3,4-tetracarboxylic acid,
cyclopentane-1,2,3,4-tetracarboxylic acid,
pyrrolidine-2,3,4,5-tetracarboxylic acid,
thiophene-2,3,4,5-tetracarboxylic acid,
pyrazine-2,3,5,6-tetracarboxylic acid,
tetrahydrofurantetracarboxylic acid,
9-bromo-10-mercaptoanthracenetetracarboxylic acid,
9,10-dimercaptoanthracenedicarboxylic acid and
2,6-endovinylenecyclohexane-1,2,4,5-tetracarboxylic acid.

For the reaction with the unsaturated alcohol, in particular the tetracarboxylic anhydrides, preferably tetracarboxylic dianhydrides, are used. The reaction takes place with good, in general complete, conversion even at low temperatures, in particular from 40° to 80° C., in the presence or absence of an esterification catalyst, e.g. dimethylaminopyridine.

Preferably, 1 mol of tetracarboxylic acid or anhydride thereof are esterified with from 1 to 3 mol of unsaturated alcohol so that from 1 to 3 unsaturated groups are present in the molecule. The tetracarboxylic diester having two unsaturated ester groups is particularly preferred.

If the tetracarboxylic dianhydrides are used as starting materials, the corresponding diesters are initially formed, even with an excess of the unsaturated alcohol.

The diester can then be isolated from the mixture or can be further used as a mixture together with the excess alcohol as a reactive diluent.

The carboxylic acid groups which have not been esterified with unsaturated alcohol can, if desired, also be esterified with other, saturated alcohols.

Examples are $C_1$–$C_8$-alkanols, phenol, benzyl alcohol, phenoxypropyl or phenoxyethyl alcohol and polyalkoxyglycol ethers or polyoxyglycol esters.

Suitable radiation-sensitive tetracarboxylic acid derivatives can also be obtained by first reacting tetracarboxylic anhydrides with saturated alcohols, at least one carboxyl group, preferably two carboxyl groups, remaining unesterified. The saturated tetracarboxylates obtained can then form salts or adducts with ethylenically unsaturated amines, amides or onium compounds.

In the case of ethylenically unsaturated amines, tertiary amines are preferred. These readily form corresponding salts with the carboxylic acid groups. Examples of suitable amines are esters of alkylaminoalkyl alcohols with unsaturated carboxylic acids, such as maleic acid, cinnamic acid, crotonic acid and in particular (meth)acrylic acid. Examples are diethylaminoethyl methacrylate, diethylaminoethyl methacrylate, diethylaminoethyl acrylate, dimethylaminoethyl acrylate, diethylaminopropyl methacrylate, diethylaminopropyl acrylate, tert-butylaminoethyl acrylate, tert-butylaminoethyl methacrylate, dimethylaminoethyl cinnamate, dimethylaminopropyl cinnamate, N,N-dimethylaminoethyl(meth)acrylamide, N,N-dimethylaminopropyl(meth)acrylamide, N,N-dihydroxyethylaminoethyl(meth)acrylamide, N,N-dihydroxyethylaminopropyl(meth)acrylamide, N,N-dimethylaminopropyl(meth)acrylamide and N,N-dimethylaminopropylacrylamide.

Other suitable amino compounds are allylamines, alkylallylamines and cyclic or heterocyclic compounds, such as vinylpyridine and alkylvinylpyridines. These amines can be used alone or as mixtures.

In the case of the ethylenically unsaturated amides, too, addition complexes as described, for example for N-methylpyrrolidone with polyamic acids, by M. J. Brekner and C. Feger in J. Polym. Sci., Part A, Polymer Chemistry, 25 (1987), 2005–2020, readily form with carboxylic acid groups.

Examples of ethylenically unsaturated amides are acrylamide, methacrylamide, N-alkyl(meth)acrylamides, such as N-methyl(meth)acrylamide and N-ethy(meth)acrylamide, N,N-dialkyl(meth)acrylamides, such as N,N-dimethyl(meth)acrylamide and N,N-diethyl(meth)acrylamide, N-alkoxyalkyl(meth)acrylamides and N-(1,1-dimethyl-3-oxobutyl)acrylamide (diacetoneacrylamide) and N-(isobutoxymethyl)acrylamide.

The methylolation products of acrylamide and methacrylamide and the ethyl-like condensates of these methylolation products with mono- or polyfunctional alcohols are also suitable. N-Vinylpyrrolidone, N-acrylolylpiperidine and N-acrylolylmorpholine are also useful.

Onium salts which have at least one copolymerizable, ethylenically unsaturated group can form adducts with the tetracarboxylates which still have at least one free carboxylic acid group, resulting in a radiation-sensitive tetracarboxylic acid derivative.

Suitable onium compounds are, for example, ammonium or sulfonium compounds.

Examples of suitable ammonium compounds are quaternization products of tertiary, unsaturated amines with unsaturated epoxides, e.g. glycidyl methacrylate. The quaternization products may also be those of the abovementioned unsaturated tertiary amines with saturated epoxides, for example glycide or other quaternizing agents, for example alkyl or alkene halides.

Other suitable ammonium compounds are salts of tertiary amino compounds with organic acids, for example the corresponding acetates, formates or maleates.

Particularly suitable sulfonium compounds are the ternization products of thioethers.

For example, the ternization products of saturated and unsaturated thioethers with unsaturated epoxides, such as glycidyl (meth)acrylate, or the ternization products of saturated and unsaturated thioethers with other ternizing agents, such as alkyl halides or alkenyl halides or saturated epoxides, such as ethylene oxide and glycide, are suitable.

The quaternization of the tertiary amines or the ternization of the thio compounds is carried out with the quaternizing or ternizing agent in general at from 20° to 50° C. in the presence of an acid. The nucleophilicity of the anion should be so low that it does not react with the onium group.

Examples of acids are acetic acid and oxalic acid as well as unsaturated acids, such as maleic acid, carboxylic acid or cinnamic acid. The tetracarboxylates which still have at least one free carboxylic acid group can also be used as an acid in the quaternization or ternization.

In total, the radiation-sensitive tetracarboxylic acid derivatives contain at least one ethylenically unsaturated group, preferably at least two ethylenically unsaturated groups, which are introduced into the molecule by esterification of the tetracarboxylic acid or its anhydride with an unsaturated alcohol or salt or adduct formation of still free carboxylic acid groups of a tetracarboxylate with unsaturated amines, amides or onium compounds.

Radiation-sensitive tetracarboxylic acid derivatives which contain one or preferably two unsaturated ester groups (tetracarboxylic diesters) and in addition form an adduct or salt with at least one unsaturated amine or amide or with an unsaturated onium compound are also particularly preferred.

The amino- or isocyanate-containing compounds which can be subjected to polycondensation with the radiation-sensitive tetracarboxylic acid derivatives described above are compounds which are not generally ethylenically unsaturated and have at least two isocyanate or amino groups, in particular diamino compounds or the corresponding diisocyanates, which condense with the tetracarboxylic acid derivatives to form polyimides.

The isocyanate groups should be blocked if the isocyanate compounds are present as a mixture with tetracarboxylates which still have free carboxyl groups.

Blocking agents for isocyanate groups are, for example, secondary a mines, alcohols, preferably aliphatic $C_1$–$C_5$-alcohols, phenol and in particular ketoximes, such as methyl ethyl ketoxime.

Aromatic or partly aromatic diamines which contain at least one aromatic ring are preferred. These may be diamines having an aromatic ring, fused aromatic ring systems or aromatic rings which are bonded, for example, by a single bond, an ether, carbonyl or sulfonyl group or aliphatic hydrocarbon radicals, in particular having 1 to 8 carbon atoms and, if required, also hetero atoms, such as sulfur, nitrogen or oxygen. The aromatic rings or ring systems may carry, as substituents, in particular $C_1$–$C_6$-alkyl, alkoxy or halogen, such as chlorine or fluorine.

Examples are:
p-phenylenediamine,
m-phenylenediamine,
4,4'-diaminodiphenyl oxide,
3,3'-diaminodiphenyl oxide,
3,4'-diaminodiphenyl oxide,
4,4'-diaminodiphenyl sulfide,
3,3'-diaminodiphenyl sulfide,
3,4'-diaminodiphenyl sulfide,
4,4'-diaminodiphenyl sulfone,
3,3'-diaminodiphenyl sulfone,
3,4'-diaminodiphenyl sulfone,
4,4'-diaminodiphenylmethane,
3,3'-diaminodiphenylmethane,
3,4'-diaminodiphenylmethane,
4,4'-diaminodiphenylpropane,
3,3'-diaminodiphenylpropane,
4,4'-diaminodiphenylethane,
3,3'-diaminodiphenylethane,
4,4'-bis(4,4'-aminophenoxy)biphenyl,
4,4'-bis(4,3'-aminophenoxy)biphenyl,
2,2-bis[4-(4,4-aminophenoxy)phenyl]propane,
2,2-bis[4-(4,4-aminophenoxy)phenyl]perfluoropropane,
2,2-bis[4-(3,4-aminophenoxy)phenyl]propane,
2,2-bis[4-(3,3'-aminophenoxy)phenyl]propane,
2,2-bis[4-(4,4'-aminophenoxy)phenyl]sulfone,
2,2-bis[4-(3,4-aminophenoxy)phenyl]sulfone,
2,2-bis[4-(3,3'-aminophenoxy)phenyl]sulfone,
4,4'-dimethyl-3,3'-diaminodiphenyl sulfone,
2,2-bis[4-(4,4'-aminophenoxy)phenyl]sulfide,
2,2-bis[4-(3,4-aminophenoxy)phenyl]sulfide,
2,2-bis[4-(3,3'-aminophenoxy)phenyl]sulfide,
2,2-bis[4-(4,4'-aminophenoxy)phenyl]methane,
2,2-bis[4-(3,4-aminophenoxy)phenyl]methane,
2,2-bis[4-(3,3'-aminophenoxy)phenyl]methane,
1,4-bis-(4,4'-aminophenoxy)phenylene,
1,4-bis-(3,4'-aminophenoxy)phenylene,
1,4-bis-(3,3'-aminophenoxy)phenylene,
4,4'-diaminobenzanilide,
3,4'-diaminobenzanilide,
3,3'-diaminobenzanilide,
4,4'-diaminobiphenyl (benzidine),
3,4'-diaminobiphenyl,
3,3'-diaminobiphenyl,
3,3'-dimethoxy-4,4'-diaminobiphenyl,
3,3'-dimethoxy-3,4'-diaminobiphenyl,
3,3'-dimethyl-4,4'-diaminobiphenyl,
3,3'-dimethyl-3,4'-diaminobiphenyl,
1,8-diaminonaphthalene,
1,5-diaminonaphthalene,
p-terphenyl-4,4''-diamine,
p-terphenyl-3,3''-diamine,
5-tert-butyl-2,4-toluylenediamine,
3-tert-butyl-2,6-toluylenediamine,
3,5-diethyl-2,4-toluylenediamine,
3,5-diethyl-2,6-toluylenediamine,
α, -diamino-(polyphenylene sulfides),
m-xylylenediamine,
p-xylylenediamine,
bis-4,4'-[(2,6-diisopropyl)aminophenyl]methane,
bis-4,4'-[(2-methyl-6-isopropyl)aminophenyl]methane,
bis-4,4'-[(2,6-dimethyl)aminophenyl]methane,
bis-4,4'-[(2,6-diisopropyl)aminophenyl]ether,
bis-4,4'-[(2-methyl-6-isopropyl)aminophenyl]ether,
bis-4,4'-[(2,6-dimethyl)aminophenyl]ether,
diamino-(dimethyl)dicyclohexylmethane,
diamino-(dimethyl)diisopropyldicyclohexylmethane,
diamino-(tetraisopropyl)dicyclohexylmethane,
diamino-(diisopropyl)dicyclohexylmethane,
diisopropyltoluylenediamine,
alkylisopropyltoluylenediamine,
etc.

The term diamines is also intended to cover compounds which contain the structural element N-N, i.e. derivatives of hydrazine.

Further important amines are tetramines, such as
3,3',4,4'-tetraaminobiphenyl,
3,3',4,4'-tetraaminodiphenylmethane,
3,3',4,4'-tetraaminodiphenyl ether,
3,3',4,4'-tetraaminodiphenyl sulfone and 3,3',4,4'-tetraaminodiphenyl sulfide.

In the reaction with the tetracarboxylates, tetramines give polyaroylenebenzimidazoles as the final structure.

The aromatic diamines which are further substituted in the nucleus by reactive groups are also of importance. Such reactive substituents are, for example, carboxyl, hydroxyl and amido groups. In the case of the o-carboxamidoamines, for example of anthranilamide, polyisoindoloquinazolinediones are obtained as the final structure in the reaction with the tetracarboxylates.

A further group of diamines comprises aromatic polynuclear compounds which are bonded via benzanilide groups, e.g. 3,3'-diaminobenzanilide, 3,4'-diaminobenzanilide, 4,3'-diaminobenzanilide, 4,4'-diaminobenzanilide, 4,3'-diaminobenzanilide and the N-alkyl substitution products of these anilides, and the α-polyanilide diamines according to European Patent 271,736.

The mixture used for coating the substrates preferably contains from 0.6 to 1.5, particularly preferably from 0.9 to 1.1, mol, based on 1 mol of radiation-sensitive tetracarboxylic acid derivatives, of a diamino compound or diisocyanate compound.

The mixture may furthermore contain solvents, especially for adjusting the processing viscosity.

In addition to alcohols, esters, ketones, ethers and simple, in particular aromatic, hydrocarbons, particularly suitable solvents are those having high polarity. Examples of these are formamide, acetamide, N-methylformamide, N,N-dimethylformamide, N,N-diethylformamide, N-methylpyrrolidone, N,N-dimethylacetamide, N,N-diethylacetamide, butyrolactone, caprolactam, pyrrolidone, dimethyl sulfoxide, dimethyl sulfone, hexamethylenephosphorotriamide, dimethylpropyleneurea and dimethylethyleneurea.

A substantially smaller amount of solvent can be used in the novel process than in conventional processes which start from prepolymers as radiation-sensitive precursors. The radiation-sensitive tetracarboxylates and hence amino or isocyanate compounds capable of polycondensation can be processed with a substantially higher solids content owing to their lower viscosity. It is also possible entirely to dispense with solvents if the generally solid amino compounds or isocyanate compounds are soluble in the tetracarboxylates, which may be liquid.

Furthermore, the mixtures may also contain reactive diluents, which are used for increasing the photosensitivity. At the same time, reactive diluents can react as solvents. Reactive diluents are mono- or polyethylenically unsaturated compounds. Examples of suitable compounds of this type are the abovementioned unsaturated alcohols for the esterification of the tetracarboxylic acids.

Of course, reactive diluents which have no hydroxyl function, in particular the abovementioned ethylenically unsaturated amino or amide compounds, can also be used.

In general, at least one photoinitiator is also added to the mixture.

Examples of photoinitiators are benzophenone, alkylbenzophenones, halomethylated benzophenones, Michler's ketone, anthrone and halogenated benzophenones. Benzoin and its derivatives are also suitable. Anthraquinone and many of its derivatives, for example β-methylanthraquinone, tert-butylanthraquinone and anthraquinonecarboxylates, and acylphosphine oxides, e.g. 2,4,6-trimethylbenzoyldiphenylphosphine oxide (Lucirin ® TPO) are also effective photoinitiators.

Their amount is in general from 0.1 to 10, in particular from 0.2 to 5, % by weight, based on the mixture of radiation-sensitive tetracarboxylic acid derivative and amino or isocyanate compound and reactive diluents.

The content of radiation-sensitive tetracarboxylic acid derivatives, and amino or isocyanate compound in the mixture is in general from 30 to 80, preferably from 50 to 70, % by weight, based on the total mixture.

For the production of a structured layer, the mixture is applied to a substrate surface, for example of silicon, silica or silicon nitride.

Prior to coating, preliminary drying generally takes place, with the result that any solvents present are removed. The preliminary drying is preferably carried out at from 30° to 140° C., particularly preferably from 80° to 120° C. It may be effected under air but is carried out in particular under inert gases, such as nitrogen, or under reduced pressure. The duration of the preliminary drying is preferably from 5 to 30 minutes.

The layer is then covered by a negative, for example an aluminum foil in which the parts to be exposed have been cut out.

As a result of exposure to high-energy light, in particular UV light, the soluble precursors are converted into an insoluble or slightly soluble intermediate by dimer or oligomer formation of the ethylenically unsaturated groups.

Conventional exposure times in the case of UV lamps having a radiant energy of from 10 to 50 mJ/cm$^2$ are from 10 to 120 seconds.

Exposure may be followed by subsequent drying, in particular at from 60° to 120° C., preferably from 70° to 100° C., in order to improve the precision of the structures.

The duration is preferably from 5 to 10 minutes.

After the negative has been removed, the unexposed parts can be washed out with a suitable solvent.

Finally, the structured layer obtained is cured at high temperatures, in particular at from 300° to 400° C., i.e. the polycondensation, in general polyimide formation, between the tetracarboxylates and the amino and isocyanate compounds is carried out. The unsaturated alcohols and the unsaturated amine, amide or onium compounds or dimers or oligomers thereof are eliminated and escape.

The structured layers obtained are used, for example, for the construction of electronic circuits or as insulation or protective layers for electronic components.

EXAMPLES 1 TO 7

Preparation of Mixtures of Ethylenically Unsaturated Tetracarboxylates and a Diamino Compound All work was carried out in a laboratory with UV-free light.

The solvent was initially taken in a stirred flask flushed with pure nitrogen and the tetracarboxylic anhydrides, the unsaturated hydroxy compound and, if required, the esterification catalyst were then stirred in.

The esterification was carried out at about 70° C. until the tetracarboxylic diester had formed (about 1.5 hours).

The degree of esterification was checked by HPLC and potentiometric titration.

The diamino compound, reactive diluent and photoinitiators were then added at room temperature and were dissolved in the mixture.

Abbreviations

ODPA—Oxydiphthalic dianhydride
BTDA—Benzophenonetetracarboxylic dianhydride
BAPP—2,2-Bis[(4-aminophenoxy)phenyl]propane
S100—Solvesso® 100 ($C_1$–$C_4$-alkylbenzene mixture from Esso)
NMP—N-Methylpyrrolidone
DMAP—Dimethylaminopyridine
HEA—Hydroxyethyl acrylate
HEMA—Hydroxyethyl methacrylate
BMA—Butanediol monoacrylate
BDA—Butanediol diacrylate
CA—Cinnamyl alcohol
MAMOL—Methylolmethacrylamide
MAMOL-B —Methylolmethacrylamide butyl ether (43% strength in butanol)
MAMOL-P—Methylolmethacrylamide trimethylolpropane triether
LCV—Leuco crystal violet (4,4′,4″-tris[dimethylaminophenyl]methane
MAZ—N-(4-Azidosulfonylphenyl)maleimide
BDK—Benzil dimethyl ketal

EXAMPLE 1

Solvent 90.00 g of NMP
Tetracarboxylic dianhydride:
0.05 mol (16.15 g) of BTDA
0.05 mol (15.51 g) of ODPA
Unsaturated hydroxy compound: 0.3 mol (34.8 g) of HEA
Esterification catalyst: 0.50 g of DMAP
Amino compound: 0.10 mol (41.05 g) of BAPP
Reactive diluent:
20.0 g of HEA
32.0 g of MAMOL-B
Photoinitiator:
0.40 g of LCV
8.00 g of MAZ

EXAMPLE 2

Solvent: 90.00 g of NMP
Tetracarboxylic dianhydride:
0.05 mol (15.51 g) of ODPA
0.05 mol (16.15 g) of BTDA
Unsaturated hydroxy compound: 0.3 mol (34.8 g) of HEA
Esterification catalyst: 0.50 g of DMAP
Amino compound: 0.10 mol (41.05 g) of BAPP
Photoinitiator:
0.35 g of LCV
6.50 g of MAZ

EXAMPLE 3

Solvent:
70.0 g of NMP
20.0 g of S 100
Tetracarboxylic dianhydride:
0.05 mol (15.51 g) of ODPA
0.05 mol (16.15 g) of BTDA
Unsaturated hydroxy compound:
0.3 mol (43.2 g) of BMA
Esterification catalyst:
0.50 g of DMAP
Amino compound: 0.10 mol (41.05 g) of BAPP
Reactive diluent:
20.0 g of HEA
32.0 g of MAMOL-B
Photoinitiator:
0.40 g of LCV
8.00 g of MAZ

EXAMPLE 4

Solvent: 90.0 g of NMP
Tetracarboxylic dianhydride:
0.05 mol (15.51 g) of ODPA
0.05 mol (16.15 g) of BTDA
Unsaturated hydroxy compound: 0.3 mol (40.2 g) of CA
Esterification catalyst: 0.50 g of DMAP
Amino compound: 0.10 mol (41.05 g) of BAPP
Reactive diluent:
0.0 g of HEA
0.0 g of MAMOL-P
Photoinitiator:
0.35 g of LCV
6.50 g of MAZ

EXAMPLE 5

Solvent: 0.0 g of NMP
Tetracarboxylic dianhydride:
0.05 mol (15.51 g) of ODPA
0.05 mol (16.15 g) of BTDA
Unsaturated hydroxy compound: 0.3 mol (40.2 g) of CA
Esterification catalyst: 0.50 g of DMAP
Amino compound: 0.10 mol (41.05 g) of BAPP
Reactive diluent:
30.0 g of HEA
20.0 g of MAMOL
Photoinitiator:
0.35 g of LCV
6.50 g of MAZ

EXAMPLE 6

Solvent: 90.0 g of NMP
Tetracarboxylic dianhydride:
0.05 mol (15.51 g) of ODPA
0.05 mol (16.15 g) of BTDA
Unsaturated hydroxy compound: 0.15 mol (40.2 g) of CA
Esterification catalyst: 0.50 g of DMAP
Amino compound: 0.10 mol (41.05 g) of BAPP
Reactive diluent:
30.0 g of HEA
20.0 g of MAMOL
Photoinitiator:
0.35 g of LCV
10.00 g of BDK

EXAMPLE 7

Solvent: 90.0 g of NMP
Tetracarboxylic dianhydride:
0.05 mol (16.15 g) of BTDA
0.05 mol (15.51 g) of ODPA
Unsaturated hydroxy compound: 0.3 mol (39.0 g) of HEMA
Esterification catalyst: 0.50 g of DMAP
Amino compound: 0.10 mol (41.05 g) of BAPP
This mixture (203.3 g) had a solids content of 48.86% and a viscosity of 2315 mPa.s at 25° C.
Reactive diluent:
20.0 g of HEA
32.0 g of MAMOL-B
Photoinitiator:

0.40 g of LCV
8.00 g of MAZ

The ready-to-use formulation had a solids content of 35.9% and a viscosity of 1088 mPa.s.

COMPARATIVE EXAMPLE 1 cf. European Patent 203,372, Example 1

0.07 mol (22.61 g) of BTDA and 0.07 mol (21.72 g) of ODPA were dissolved in 250 ml of NMP under dry nitrogen at room temperature while stirring, after which 0.056 mol (7.28 g) of HEMA was added. Stirring was carried out for 1 hour at room temperature and for 1 hour at 35° C. and the mixture was cooled to room temperature. A solution of 0.112 mol (45.97 g) of BAPP in 100.00 ml of NMP was then added dropwise in the course of 15 minutes.

Stirring was carried out overnight at room temperature, after which a solution of 0.29 mol (60.00 g) of N,N-dicyclohexylcarbodiimide in 120.00 ml of NMP was added dropwise. Stirring was again carried out overnight; a precipitate of N,N-dicyclohexylurea formed during this procedure. 92.00 g of HEMA were then added.

Stirring was carried out for 5 hours at 50° C. and overnight at room temperature, after which the mixture was diluted with 80.00 ml of acetone and the precipitate was filtered off. The filtrate was added dropwise to 2000.00 g of demineralised water with vigorous stirring.

A yellowish brown flocculent precipitate formed and was filtered off under suction. The filter cake was washed with water and then with methanol and was dried under reduced pressure.

The polymer was dissolved in NMP. The solution (a total of 203.3 g) had a viscosity of 72.800 mPa.s and a solids content of 48.86% by weight.

20 g of HEA and 32 g of MAMOL-B as reactive diluent and 0.4 g of LCV and 8 g of MAZ as photoinitiators were then added.

The ready-to-use formulation had a solids content of 35.9% and a viscosity of 31,650 mPa.s.

TABLE 1

Comparison of Example 7 with Comparative Example 1

| Example | Ready-to-use coating | | Shelf life (doubling of viscosity) |
|---|---|---|---|
| | Solids content [%] | Viscosity [mPa.s] | |
| B7 | 35.9 | 1088 | >500 days |
| VB | 35.9 | 31650 | 32 days |

Testing of Performance Characteristics for Examples 1 to 7

The coatings were applied to cleaned deep-drawn metal sheets using a knife coater having a 50 μm high gap. Preliminary drying was carried out in a cabinet under reduced pressure on a heated plate at 90° C. in the course of 10 minutes. For the exposure, a part of the sample was covered with an aluminum foil. The exposure was carried out under a broad-band high pressure mercury lamp with an emission maximum at wavelength of about 360 nm and an energy of 22 mJ/cm$^2$ (measured in the plane of the films to be exposed). The exposure time was one minute at a distance of 15 cm.

After the exposure, a subsequent heat treatment was carried out for 10 minutes on a hotplate at 90° C. To test for a solubility difference between the exposed and the unexposed parts of the sample, the latter was treated for 3 minutes in a 7:3 mixture of NMP and ethanol in a beaker with magnetic stirrer and was washed with ethanol.

In all Examples, good solubility differentiation was found, i.e. the unexposed parts had been removed and the exposed parts had not been attacked by the solvent.

After the development, the metal sheets were placed in a program-controlled oven preheated to 50° C. and were heated at a rate of 5° C./minute to 350° C., kept at this temperature for 30 minutes, removed from the oven and cooled to room temperature.

In all cases, the polyimide films obtained had good flexural strength and scratch resistance and exhibited the strong band at wave nun%her 1777 in the IR spectrum, said band being typical of polyimides.

EXAMPLES 8 TO 13

Preparation of Mixtures of Adducts of Tetracarboxylates with Ethylenically Unsaturated Amino or Amido Compounds and Diamino Compounds The preparation was carried out as in Examples 1 to 7. The ethylenically unsaturated amino or amido compound was stirred into the mixture.

EXAMPLE 8

Unsaturated Ester + Unsaturated Amine

Solvent: 90.00 g of NMP
Tetracarboxylic dianhydride:
0.05 mol (15.51 g) of ODPA
0.05 mol (16.15 g) of BTDA
Unsaturated hydroxy compound: 0.30 mol (39.00 g) of HEMA
Esterification catalyst: 0.50 g of DMAP
Amino compound: 0.10 mol (41.05 g) of BAPP
Reactive diluent: 20.86 g of HEA
Unsaturated amine: 0.20 mol (31.14 g) of N,N-dimethylaminoethyl methacrylate
Photoinitiator:
0.40 g of LCV
8.00 g of MAZ The ready-to-use formulation had a solids content of 35.9% and a viscosity of 2300 mPa.s.

EXAMPLE 9

Saturated Ester + Unsaturated Amine

As in Example 8, except that the saturated hydroxy compound was used instead of the unsaturated hydroxy compound.

Saturated hydroxy compound: 0.30 mol (32.40 g) of benzyl alcohol

The ready-to-use formulation had a solids content of 36.4% and a viscosity of 2500 mPa.s.

EXAMPLE 10

Unsaturated Ester + Unsaturated Amide

Solvent: 90.0 g of NMP
Tetracarboxylic dianhydride:
0.05 mol (15.51 g) of ODPA
0.05 mol (16.15 g) of BTDA
Unsaturated hydroxy compound: 0.30 mol (39.00 g) of HEMA
Esterification catalyst: 0.50 g of DMAP
Amino compound: 0.10 mol (41.05 g) of BAPP
Reactive diluent: 20.86 g of HEA
Unsaturated amide: (is only stirred in) 0.20 mol (31.14 g) of N-(isobutoxymethyl)acrylamide Photoinitiator:
0.40 g of LCV
8.00 g of MA The ready-to-use formulation had a solids content of 35.9% and a viscosity of 1260 mPa.s.

EXAMPLE 11

Saturated Ester + Unsaturated Amide

As in Example 10, except that a saturated hydroxy compound was used instead of the unsaturated hydroxy compound.

Saturated hydroxy compound: 0.30 mol (32.40 g) of benzyl alcohol

The ready-to-use formulation had a solids content of 36.4% and a viscosity of 1540 mPa.s.

EXAMPLE 12

Unsaturated Ester + Unsaturated Amide

Solvent: 90.00 g of NMP
Tetracarboxylic dianhydride:
0.05 mol (16.15 g) of BTDA
0.05 mol (15.51 g) of ODPA
Unsaturated hydroxy compound: 0.30 mol (39.00 g) of HEMA (1.5 equivalents)
Esterification catalyst: 0.50 g of DMAP
Amino compound: 0.10 mol (41.05 g) of BAPP
Unsaturated amido compound (methylolamidoether) 0.20 mol (68.20 g) of methylolacrylamide glyceryl triether
Photoinitiator:
0.40 g of LCV
8.00 g of MAZ The ready-to-use formulation had a solids content of 32.7% and a viscosity of 1970 mPa.s.

EXAMPLE 13

Saturated Ester + Unsaturated Methylolamidoether

As in Example 12, except that a saturated hydroxy compound was used instead of an unsaturated hydroxy compound.

Saturated hydroxy compound: 0.30 mol (32.40 g) of benzyl alcohol

The ready-to-use formulation had a solids content of 33.6% and a viscosity of 2130 mPa.s.

TESTING OF EXAMPLES 8 TO 13

The coatings were applied to cleaned deep-drawn metal sheets by means of a knife coater. A coater gap height which resulted in a layer thickness of about 20 μm after preliminary drying was determined by initial tests. The coatings were predried in a cabinet under reduced pressure on a heated plate for 30 minutes at 110° C. For exposure, part of the sample was covered with an aluminum foil. The exposure was carried out under a broad-band high pressure mercury lamp with an emission maximum at a wavelength of about 360 nm. Four samples were exposed in each case, with increasing exposure times of 15, 30, 45 and 60 seconds, at a distance of 15 cm. The energy of the radiation was 22 mJ/cm$^2$, measured at a wavelength of about 360 nm in the plane of the films to be exposed. After the exposure, a subsequent heat treatment was carried out for 3 minutes at 90° C. on a hotplate. To test for a solubility difference between the exposed and unexposed parts of the sample, the latter was treated (developed) in a mixture of NMP/ethanol (7:3 parts by volume) for 3 minutes in a beaker with a magnetic stirrer and was washed with ethanol and blown dry with air.

The photosensitivity is evident from the decrease in layer thickness in the exposed part of the sample (removal of material on exposure to light).

The exposure time after which no, or no substantial, removal of material on exposure to light is found is a measure of the photosensitivity (Table 1).

The structured films were then cured as described above.

In all cases, the polyimide films obtained had good flexural strength and scratch resistance and exhibited the strong band at the wave number 1777 in the IR spectrum, which band is typical of polyimides.

TABLE 1

| | | Removal of material on exposure to light | |
|---|---|---|---|
| Example No. | Exposure time [s] | Removal of material on exposure to light from → to [μm] | Remarks |
| 8 | 15 | 27 → 22 | Residual film soft |
| | 30 | 26 → 23 | Residual film still slightly soft |
| | 45 | 27 → 27 | Residual film firm, not swollen |
| | 60 | 27 → 27 | Residual film firm, not swollen |
| 9 | 15 | 27 → 22 | Residual film soft |
| | 30 | 26 → 28 | Residual film swollen |
| | 45 | 28 → 28 | Residual film firm, not swollen |
| | 60 | 26 → 26 | Residual film firm, not swollen |
| 10 | 15 | 26 → 24 | Residual film still slightly soft |
| | 30 | 28 → 26 | Residual film still slightly soft |
| | 45 | 25 → 25 | Residual film firm, not swollen |
| | 60 | 27 → 26 | Residual film firm, not swollen |
| 11 | 15 | 26 → 29 | Residual film swollen, soft |
| | 30 | 28 → 32 | Residual film swollen, soft |
| | 45 | 27 → 27 | Residual film firm, not swollen |
| | 60 | 28 → 28 | Residual film firm, not swollen |
| 12 | 15 | 27 → 24 | Residual film soft |
| | 30 | 26 → 26 | Residual film soft |
| | 45 | 28 → 28 | Residual film firm, not swollen |
| | 60 | 26 → 26 | Residual film firm, not swollen |
| 13 | 15 | 26 → 27 | Residual film soft |
| | 30 | 28 → 30 | Residual film swollen |
| | 45 | 30 → 30 | Residual film firm, not swollen |
| | 60 | 28 → 28 | Residual film firm, not swollen |
| VB 1 | 15 | 28 → 0 | Everything removed |
| | 30 | 23 → 14 | Residual film very soft |
| | 45 | 25 → 18 | Residual film soft |
| | 60 | 26 → 27 | Residual film still slightly soft |

EXAMPLES 14 TO 16

Preparation of Mixtures of Adducts of Tetracarboxylates with Ethylenically Unsaturated Onium Compounds and Diamino Compounds Further Abbreviations:
TGD—Thiodiglycol
GLY—Glycidyl 2,3-epoxy-1-hydroxypropane
GLYMA—Glycidyl methacrylate
EO—Ethylene oxide
HQME—Hydroquinone monomethyl ether

EXAMPLE 14

A tetracarboxylic diester was first prepared, as described above:

Solvent: 90.00 g of NMP
Tetracarboxylic anhydride:
0.05 mol (16.15 g) of BTDA
0.05 mol (15.51 g) of ODPA
Unsaturated hydroxy compound: 0.20 mol (26.60 g) of HEMA Esterification catalyst: 0.50 g of DMAP
After the esterification, an ammonium compound was prepared in situ by adding
unsaturated amine:
  0.10 mol (15.70 g) of N,N-dimethylaminoethyl methacrylate
quaternizing agent:
  0.10 mol (7.40 g) of GLY
and stirring for 3 hours, said ammonium compound forming an adduct with the remaining carboxylic acid groups of the diester. The further components were then added as described above:
Amino compounds
  0.10 mol (41.05 g) of BAPP
which dissolved after about 15 minutes, the temperature increasing to 65° C., and the mixture was cooled to room temperature and the following was stirred in:
Reactive diluent:
  20.00 g of HEA
  32.00 g of MAMOL-B
Photoinitiator:
  0.40 g of LCV
  8.00 g of MAZ

EXAMPLE 15

The procedure was as in Example 14, except that the reaction was carried out in a pressure-resistant laboratory autoclave. After the addition of the unsaturated amine, the autoclave was let down to 2 mbar, after which EO was forced in to a superatmospheric pressure of 3 bar and stirring was carried out at 50° C. for 4 hours, the pressure decreasing to 1.3 bar; the pressure was let down, the autoclave was flushed with nitrogen and the procedure was continued as in Example 1.

EXAMPLE 16

Preparation of a Sulfonium Compound 79.4 g of TDG, 184.6 g of GLYMA, 0.18 g of HQME and 60 g of acetic acid were mixed at room temperature and then heated at 40° C. for 8 hours. After this time, the conversion based on the acetic acid was quantitative (potentiometric titration with tetrabutylammoniumhydroxide). The yield of sulfonium acetate was 75% (potentiometric titration with perchloric acid).

Preparation of the Formulation

A mixture of tetracarboxylate and diamino compound was then prepared as described above and the sulfonium compound was stirred into this mixture.
Solvent: 90.00 g of NMP
Tetracarboxylic dianhydride:
  0.05 mol (15.51 g) of ODPA
  0.05 mol (16.15 g) of BTDA
Unsaturated hydroxy compound: 0.15 mol (17.40 g) of HEA
Esterification catalyst: 0.50 g of DMAP
Amino compound: 0.10 mol (41.05 g) of BAPP
Unsaturated sulfonium compound 65.00 g
Photoinitiator:
  0.35 g of LCV
  6.50 g of MAZ The test for Examples 14 to 16 was carried out similarly to the test for Examples 8 to 13. The results are shown in Table 2.

TABLE 2

| | | Removal of material on exposure to light | |
|---|---|---|---|
| Example No. | Exposure time [s] | Removal of material on exposure to light from → to [μm] | Remarks |
| 14 | 15 | 23 → 10 | Residual film soft |
| | 30 | 23 → 19 | Residual film still slightly soft |
| | 45 | 25 → 24 | Residual film firm |
| | 60 | 22 → 22 | Residual film firm |
| 15 | 15 | 24 → 18 | Residual film still slightly soft |
| | 30 | 25 → 23 | Residual film firm |
| | 45 | 25 → 24 | Residual film firm |
| | 60 | 24 → 24 | Residual film firm |
| 16 | 15 | 27 → 0 | Everything removed |
| | 30 | 26 → 23 | Residual film still slightly soft |
| | 45 | 27 → 27 | Residual film firm |
| | 60 | 26 → 26 | Residual film firm |

We claim:
1. A process for the production of a structured coating of a heat-resistant polycondensate on a substrate which comprises, (1) providing a substrate; (2) preparing a mixture consisting essentially of a radiation-sensitive tetracarboxylic acid derivative and a compound which is polycondensible with the radiation-sensitive tetracarboxylic acid derivative by mixing (a) at least one first compound selected from the group consisting of an ester of an ethylenically unsaturated tetracarboxylic acid, an adduct of an ethylenically unsaturated tetracarboxylic acid and a salt of an ethylenically unsaturated tetracarboxylic acid, which compound has at least one free carboxylic acid group and (b) at least one compound selected from the group consisting of an ethylenically unsaturated amine, an ethylenically unsaturated amide and an ethylenically unsaturated onium compound to form the radiation-sensitive tetracarboxylic acid derivative; adding (c) at least one third compound which is polycondensible with the radiation-sensitive tetracarboxylic acid derivative and which contains at least two groups selected from group consisting of amino, isocyanate, and blocked isocyanate, and (d) at least one photoinitiator; (3) applying the mixture as a layer to the substrate; (4) exposing the thus-prepared layer to high-energy light through a negative to selectively expose portions to the layer while leaving other portions unexposed, the exposed portions forming insoluble compounds while the unexposed portions remain soluble; (5) removing the unexposed soluble portions; and (6) subjecting the substrate and remaining insoluble portions to temperatures of 300° to 400° C. form a polycondensation product of the radiation-sensitive tetracarboxylic acid derivative with the third compound on the substrate.

2. A process according to claim 1, wherein the third compound is at least one aromatic diamino compound.

* * * * *

UNITED STATES PATENT AND TRADEMARK OFFICE
CERTIFICATE OF CORRECTION

PATENT NO.: 5,350,663

DATED:     September 27, 1994

INVENTOR(S):   BLUM et al.

It is certified that error appears in the above-identified patent and that said Letters Patent is hereby corrected as shown below:

Column 16, claim 1, line 45,
   after "from" insert -- the --

Column 16, claim 1, line 50,
   delete "to" and replace with -- of --

Column 16, claim 1, line 55,
   after "C." insert -- to --

Signed and Sealed this

Twenty-second Day of November, 1994

*Attest:*

BRUCE LEHMAN

*Attesting Officer*     Commissioner of Patents and Trademarks